US008866474B2

(12) United States Patent
Muraoka et al.

(10) Patent No.: US 8,866,474 B2
(45) Date of Patent: Oct. 21, 2014

(54) MAGNETIC SENSOR DEVICE

(75) Inventors: Daisuke Muraoka, Chiba (JP); Minoru Ariyama, Chiba (JP); Tomoki Hikichi, Chiba (JP); Kentaro Fukai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 276 days.

(21) Appl. No.: 13/609,972

(22) Filed: Sep. 11, 2012

(65) Prior Publication Data
US 2013/0076350 A1    Mar. 28, 2013

(30) Foreign Application Priority Data

Sep. 27, 2011 (JP) ................................. 2011-211221

(51) Int. Cl.
*G01R 33/02* (2006.01)
*G01R 33/07* (2006.01)
*G01R 33/00* (2006.01)

(52) U.S. Cl.
CPC .......... *G01R 33/072* (2013.01); *G01R 33/0023* (2013.01)
USPC ......................................... 324/244; 324/251

(58) Field of Classification Search
USPC ........................................................ 324/244
See application file for complete search history.

(56) References Cited

U.S. PATENT DOCUMENTS

2003/0205996 A1    11/2003  Hara et al.
2004/0196033 A1*   10/2004  Hara et al. ................... 324/251

* cited by examiner

*Primary Examiner* — Bot Ledynh
(74) *Attorney, Agent, or Firm* — Brinks Gilson & Lione

(57) ABSTRACT

A magnetic sensor device for generating a logic output in accordance with a magnetic field intensity applied to a magnetoelectric conversion element includes: a comparator for inputting amplified output signals of the magnetoelectric conversion element, and outputting a comparison result; and a logic circuit for performing arithmetic processing on an output signal of the comparator. Only when the logic output is changed by a change in the magnetic field intensity, the logic circuit performs successive matching determination of logic outputs a plurality of times. Thus, the variation in determination for detection or canceling of a magnetic field intensity, which is caused by noise generated from respective constituent elements included in the magnetic sensor device and external noise, may be reduced while suppressing electric power consumption.

8 Claims, 5 Drawing Sheets when detection or canceling is determined for the S-pole when detection or canceling is determined for the N-pole

MAGNETIC SENSOR DEVICE

RELATED APPLICATIONS

This application claims priority under 35 U.S.C. §119 to Japanese Patent Application No. 2011-211221 filed on Sep. 27, 2011, the entire content of which is hereby incorporated by reference.

BACKGROUND OF THE INVENTION

1. Field of the Invention

The present invention relates to a magnetic sensor device for converting a magnetic field intensity into an electric signal, and more particularly, to a magnetic sensor device to be employed as a sensor for detecting an open/close state used in a flip phone, a notebook computer, or the like, or a sensor for detecting a rotational position of a motor.

2. Description of the Related Art

A magnetic sensor device has been employed as a sensor for detecting the open/close state used in a flip phone, a notebook computer, or the like, or a sensor for detecting a rotational position of a motor (for example, see Japanese Patent Application Laid-open No. 2001-337147).

In the magnetic sensor device, a magnetoelectric conversion element (for example, Hall element) outputs a voltage proportional to a magnetic field intensity or a magnetic flux density, an amplifier amplifies the output voltage, and a comparator determines the voltage to output a binary signal of an H signal or an L signal. The output voltage of the magnetoelectric conversion element is minute, and hence, easily affected by an offset voltage (element offset voltage) of the magnetoelectric conversion element, an offset voltage (input offset voltage) of the amplifier or the comparator, or noise within the conversion device, which leads to a problem. The element offset voltage is mainly generated by a stress or the like exerted on the magnetoelectric conversion element by a package. The input offset voltage is mainly generated by a characteristic variation of an element that forms an input circuit of the amplifier. The noise is mainly generated by flicker noise of a monolithic transistor that forms a circuit, or thermal noise of the monolithic transistor or a resistive element.

In order to reduce an influence of the above-mentioned offset voltage of the magnetoelectric conversion element or the amplifier, the magnetic sensor device illustrated in FIG. 4 has been devised.

The conventional magnetic sensor device is configured to include a Hall element 1, a switching circuit 2 that switches between a first detection state and a second detection state of the Hall element 1, a differential amplifier 3 that amplifies a voltage difference (V1−V2) of two output terminals of the switching circuit 2, a capacitor C1 having one end connected to one output terminal of the differential amplifier 3, a switch S1 connected between another output terminal of the differential amplifier 3 and another end of the capacitor C1, a comparator 4, and a D-type flip-flop D1. In the first detection state, a supply voltage is input from terminals A and C, and a detection voltage is output from terminals B and D. In the second detection state, the supply voltage is input from the terminals B and D, and the detection voltage is output from the terminals A and C.

It is assumed that a differential output voltage of the magnetoelectric conversion element is Vh, a gain of the differential amplifier is G, and the input offset voltage of the differential amplifier is Voa. In the first detection state, the switch S1 is turned on, and the capacitor C1 is charged with $Vc1=V3-V4=G(Vh1+Voa)$. Then, in the second detection state, the switch S1 is turned off, and $Vc2=V3-V4=G(-Vh2+Voa)$ is output. Here, $V5-V6=V3-Vc1-V4=Vc2-Vc1=-G(Vh1+Vh2)$ is satisfied, to thereby cancel out the influence of the input offset voltage. Further, the detection voltages Vh1 and Vh2 of the magnetoelectric conversion element generally have an in-phase valid signal component and a reverse-phase element offset component, and hence the influence of the element offset component is also removed from the above-mentioned output voltage. An applied magnetic field intensity and a reference voltage are compared with each other by the comparator and an output result obtained by the comparison is latched. In the case illustrated in FIG. 4, the reference voltage is an in-phase voltage in the magnetoelectric conversion element, which may be arbitrarily set by an additional circuit.

However, the conventional magnetic sensor device has a problem that, the influence of noise (flicker noise and thermal noise) generated in the respective constituent elements included in the sensor device and the influence of external noise cannot be completely suppressed, and hence a magnetic field intensity varies when detected or canceled. In particular, noise generated in an input terminal portion of the differential amplifier 3 is amplified and thus becomes a main factor.

SUMMARY OF THE INVENTION

The present invention has been devised in order to solve the above-mentioned problem, and it is an object thereof to provide a magnetic sensor device for repeating operations of magnetic field detection a plurality of times and performing matching of results of the determination, to thereby suppress an influence of noise and detect or cancel a magnetic field intensity with high precision. It is another object of the present invention to suppress unnecessary electric power consumption by performing the matching a plurality of times only when a change has occurred from a previous detection state.

In order to solve the above-mentioned problem inherent in the related art, the magnetic sensor device according to an exemplary embodiment of the present invention is configured as follows.

A magnetic sensor device for generating a logic output in accordance with a magnetic field intensity applied to a magnetoelectric conversion element includes: a comparator for inputting amplified output signals of the magnetoelectric conversion element; and a logic circuit for performing arithmetic processing on an output signal of the comparator. Only when the logic output is changed by a change in the magnetic field intensity, the logic circuit performs successive matching determination of logic outputs a plurality of times.

According to the magnetic sensor device of the present invention, a variation in determination for detection or canceling of a magnetic field intensity, which is caused by noise generated from respective constituent elements included in the magnetic sensor device and external noise, can be reduced while suppressing electric power consumption. Therefore, the present invention can provide a magnetic sensor device capable of detecting and canceling the magnetic field intensity with high precision and with a low consumption current.

DETAILED DESCRIPTION OF THE PREFERRED EMBODIMENT

A magnetic sensor device according to the present invention is widely used as a sensor for detecting a state of a magnetic field intensity, such as a sensor for detecting an open/close state in a flip phone, a notebook computer, or the like, or a sensor for detecting a rotational position of a motor. In the following embodiments, a magnetic sensor device using a magnetoelectric conversion element is described. Alternatively, however, a conversion device according to the present invention may employ a conversion element that similarly outputs a voltage according to acceleration or a pressure, in place of the magnetoelectric conversion element that outputs a voltage according to the magnetic field intensity.

Figure 1:
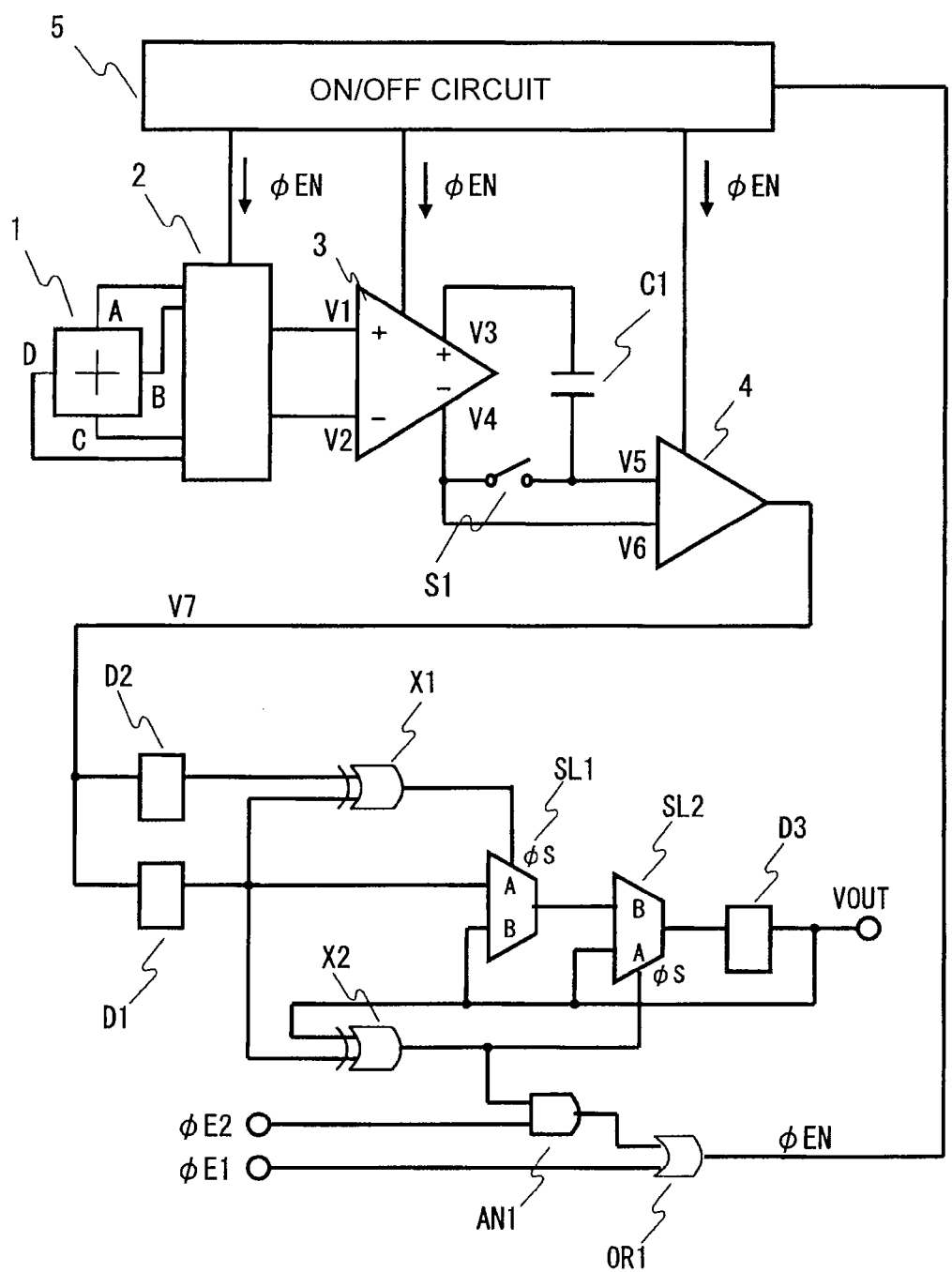
FIG. 1 is a circuit diagram illustrating a magnetic sensor device according to an embodiment of the present invention.

FIG. 1 is a circuit diagram of the magnetic sensor device of this embodiment. The magnetic sensor device of this embodiment includes a Hall element 1 serving as a magnetoelectric conversion element, a switching circuit 2, a differential amplifier 3, a comparator 4, an ON/OFF circuit 5, D-type flip-flops D1, D2, and D3, XOR circuits X1 and X2, selector circuits SL1 and SL2, an AND circuit AN1, an OR circuit OR1, a capacitor C1, a switch S1, an output terminal VOUT, and ON/OFF signal sources φE1 and φE2. The Hall element 1 has a first terminal pair A-C and a second terminal pair B-D. The switching circuit 2 has four input terminals connected to the respective terminals A, B, C, and D of the Hall element 1, a first output terminal, and a second output terminal. The differential amplifier 3 has a first input terminal, a second input terminal, a first output terminal, and a second output terminal. The selector circuits SL1 and SL2 each have an input terminal A, an input terminal B, a select terminal φS, and an output terminal.

The differential amplifier 3 has the first output terminal connected to one end of the capacitor C1 and the second output terminal connected to one end of the switch S1. The comparator 4 has a first input connected to another end of the capacitor C1 and another end of the switch S1, a second input connected to the second output terminal of the differential amplifier 3, and an output connected to the D-type flip-flop D1 and the D-type flip-flop D2. The XOR circuit X1 has a first input connected to an output of the D-type flip-flop D1, a second input connected to an output of the D-type flip-flop D2, and an output connected to the select terminal φS of the selector circuit SL1. The XOR circuit X2 has a first input connected to the output of the D-type flip-flop D1 and the input terminal A of the selector circuit SL1, and a second input connected to the input terminal B of the selector circuit SL1, the input terminal A of the selector circuit SL2, an output of the D-type flip-flop D3, and the output terminal VOUT. The XOR circuit X2 has an output connected to the select terminal φS of the selector circuit SL2 and a first input of the AND circuit AN1. The selector circuit SL2 has the input terminal B connected to the output terminal of the selector circuit SL1, and the output terminal connected to an input of the D-type flip-flop D3. The AND circuit AN1 has a second input connected to the ON/OFF signal source φE2 and an output connected to a first input of the OR circuit OR1. The OR circuit OR1 has a second input connected to the ON/OFF signal source φE1 and an output connected to the ON/OFF circuit 5. The ON/OFF circuit 5 outputs a φEN signal to the switching circuit 2, the differential amplifier 3, and the comparator 4.

Figure 5:
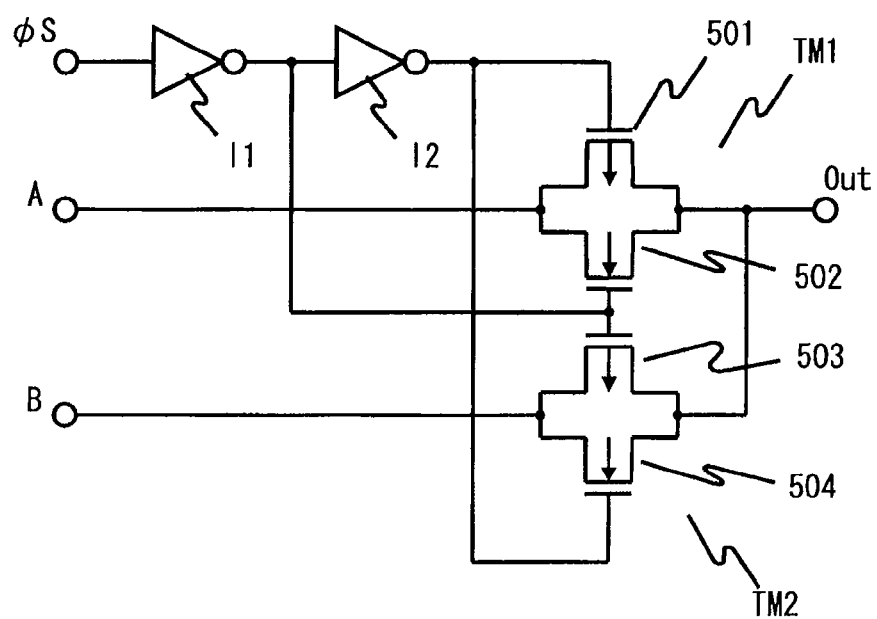
FIG. 5 is a circuit diagram illustrating an example of a selector circuit.

FIG. 5 illustrates an example of a circuit diagram of the selector circuits SL1 and SL2. The selector circuit includes a PMOS transistor 501 and an NMOS transistor 502 serving as a transmission gate TM1, a PMOS transistor 503 and an NMOS transistor 504 serving as a transmission gate TM2, and inverters I1 and I2. Connections are made as follows. The select terminal φS is connected to an input of the inverter I1. The inverter I1 has an output connected to an input of the inverter I2, a gate of the NMOS transistor 502, and a gate of the PMOS transistor 503. The inverter I2 has an output connected to a gate of the PMOS transistor 501 and a gate of the NMOS transistor 504. The PMOS transistor 501 has a drain connected to the input terminal A and a drain of the NMOS transistor 502, and has a source connected to the output terminal and a source of the NMOS transistor 502. The PMOS transistor 503 has a drain connected to the input terminal B and a drain of the NMOS transistor 504, and has a source connected to the output terminal and a source of the NMOS transistor 502. ON/OFF of the two transmission gates TM1 and TM2 is controlled by an H/L input signal from the select terminal φS, and hence the transmission gates TM1 and TM2 serve to transmit any one of the signals from the input terminal A and the input terminal B to the output terminal.

Figure 6:
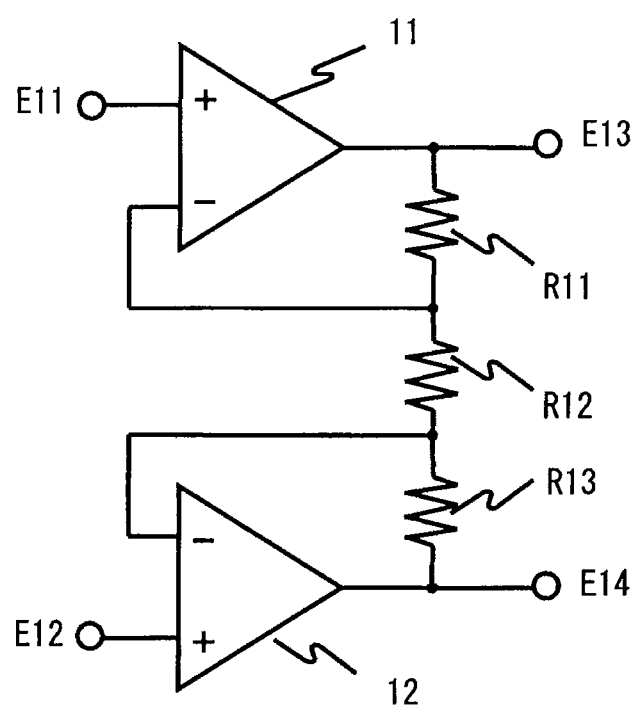
FIG. 6 is a circuit diagram illustrating an example of a differential amplifier.

FIG. 6 illustrates an example of a circuit diagram of the differential amplifier 3. The differential amplifier 3 is typically configured as an instrumentation amplifier. The differential amplifier 3 has differential amplifiers 11 and 12, and resistors R11, R12, and R13. Connections are made as follows. The differential amplifier 11 has a non-inverting input terminal connected to the first input terminal, an inverting input terminal connected to a connection point between one end of the resistor R11 and one end of the resistor R12, and an output connected to the first output terminal and another end of the resistor R11. The differential amplifier 12 has a non-inverting input terminal connected to the second input terminal, an inverting input terminal connected to a connection point between one end of the resistor R13 and another end of the resistor R12, and an output connected to the second output terminal and another end of the resistor R13. The differential amplifier 3 is configured as such an instrumentation amplifier, to thereby suppress the influence of in-phase noise in the differential input.

The switching circuit 2 has a function of switching between a first detection state in which the supply voltage is input to the first terminal pair A-C of the Hall element 1 while the detection voltage is output from the second terminal pair B-D of the Hall element 1, and a second detection state in which the supply voltage is input to the second terminal pair B-D while the detection voltage is output from the first terminal pair A-C.

Figure 2:
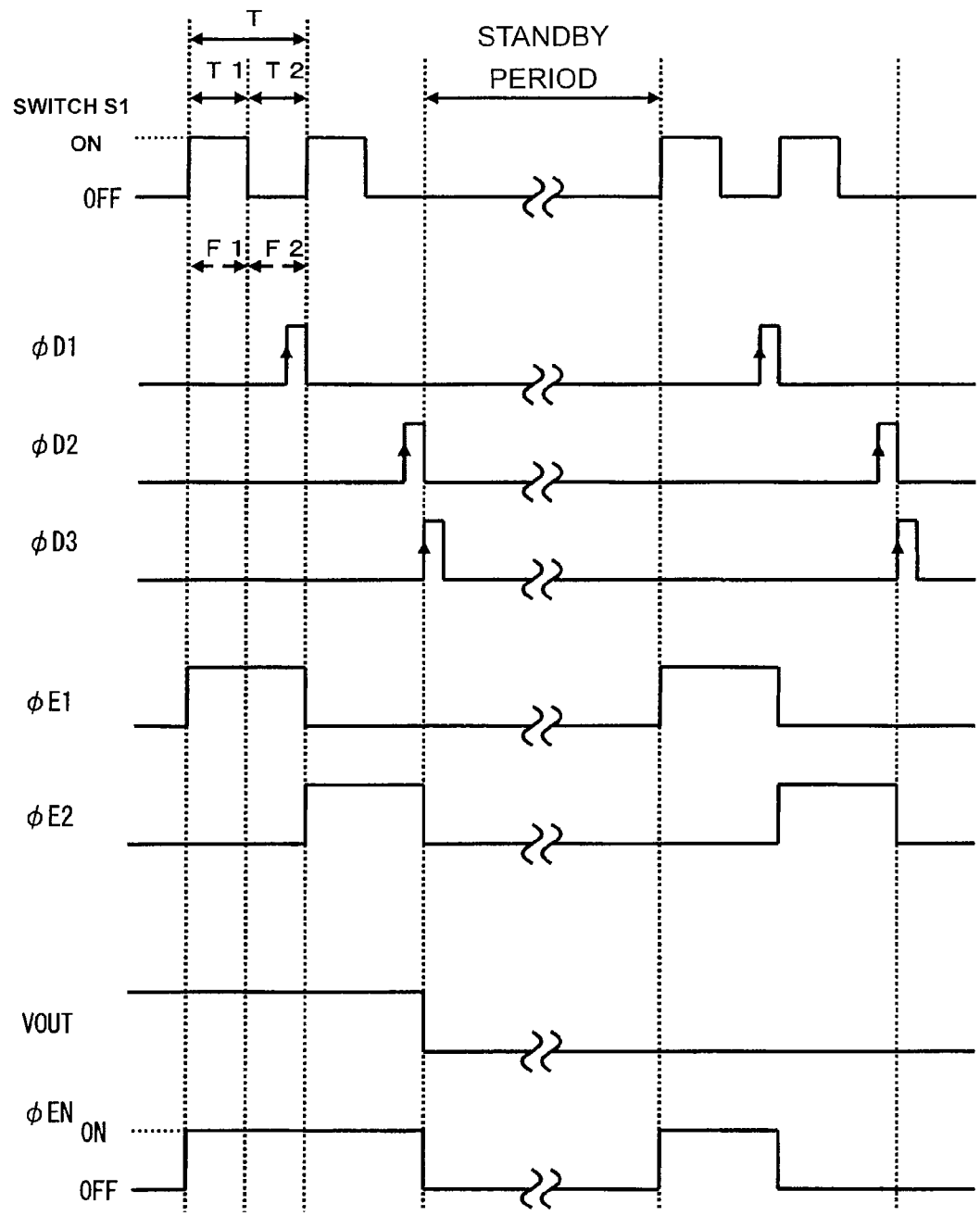
FIG. 2 is a timing chart of the magnetic sensor device according to the embodiment of the present invention.

Next, an operation of the magnetic sensor device according to this embodiment is described. FIG. 2 is a timing chart illustrating control signals in the magnetic sensor device according to this embodiment. In FIG. 2, φDm indicates a latch clock signal input to an m-th D-type flip-flop Dm. Unless otherwise specified, each D-type flip-flop latches input data at the rising of the latch clock signal from a low (L) level to a high (H) level.

One period T in detection operation is divided into a first detection state T1 and a second detection state T2 according to the operation of the above-mentioned switching circuit 2. The period T of the detection operation is also divided into a sample phase F1 and a comparison phase F2 through the opening and closing the switch S1. In the sample phase F1, the offset components of the Hall element 1 and the differential amplifier 3 are stored in the capacitor C1. In the comparison phase F2, a voltage determined according to the magnetic field intensity is compared with the detection voltage level. Here, assuming that a differential output voltage of the magnetoelectric conversion element is expressed by Vh, a gain of the differential amplifier is expressed by G, and an input offset voltage of the differential amplifier is expressed by Voa.

In the sample phase F1, the Hall element 1 goes into the first detection state T1 and the switch S1 is turned on. When the switch S1 is turned on, the capacitor C1 is charged with a voltage as follows.

$$Vc1=(V3-V4)=G(Vh1+Voa) \quad (1)$$

Subsequently, in the comparison phase F2 (second detection state T2), the switch S1 is turned off, and hence the following voltage is output.

$$Vc2=(V3-V4)=G(-Vh2+Voa) \quad (2)$$

In this case, the following expression applies.

$$V5-V6=V3-Vc1-V4=Vc2-Vc1=-G(Vh1+Vh2) \quad (3)$$

Therefore, the influence of the input offset voltage is canceled out. Detection voltages Vh1 and Vh2 of the magnetoelectric conversion element generally have in-phase effective signal components and inverted-phase element offset components, and hence the influence of the element offset components is also removed from the output voltage described above.

In the comparison phase F2, the detection voltage component of the applied magnetic field intensity, which is expressed by Expression (3), is compared with a reference voltage by the comparator 4, and a signal V7 (an H signal (VDD) or an L signal (GND)) is output.

The reference voltage in this embodiment is an in-phase voltage in the magnetoelectric conversion element. The reference voltage may be arbitrarily set by an additional circuit.

The signal V7 output from the comparator 4 is input to a logic circuit described later. The signal V7 output from the comparator 4 is latched two times at different timings by the two D-type flip-flops D1 and D2. The second latching is performed during the successive re-detection operation, that is, after a detection period T for the first latching. Then, only when the XOR circuit X1 connected to the outputs of the two D-type flip-flops D1 and D2 have the same value of the two outputs, an output signal of the comparator is input to the selector circuit SL2 via the selector circuit SL1. On the other hand, when the two outputs of the D-type flip-flops D1 and D2 have different values, the output result of the previous detection, which has been held in the D-type flip-flop D3, is directly input to the selector circuit SL2. In other words, the determination for detection or canceling is not performed unless the same detection (canceling) state continues at intervals of T, and hence an erroneous detection and an erroneous canceling caused by the influence of instantaneous noise can be prevented.

Subsequently, only when the XOR circuit X2 connected to the output result of the previous detection, which has been held in the D-type flip-flop D3, and to the output of the D-type flip-flop D1 have different values of the two outputs, an output signal of the selector circuit SL1 is input to the D-type flip-flop D3 via the selector circuit SL2, and hence the signal V7 is finally latched at a timing φD3. On the other hand, when the two output values input to the XOR circuit X2 are the same, the output result of the previous detection, which has been held in the D-type flip-flop D3, is directly input to the D-type flip-flop D3 and latched. Further, the output of the XOR circuit X2 and the ON/OFF signal φE2 are input to the AND circuit AN1, and hence, only when the two output values input to the XOR circuit X2 are different from each other, the ON/OFF signal φE2 is input to the OR circuit OR1 via the AND circuit AN1. Then, the ON/OFF signal φE1 and the ON/OFF signal φE2 are combined in the OR circuit OR1 to be output as a φEN signal. On the other hand, when the two output values input to the XOR circuit X2 are the same, the output of the AND circuit AN1 is fixed to the L signal, and hence the ON/OFF signal φE1 is directly output from the OR circuit OR1 as the φEN signal.

In other words, when the result of the first latching is different from the previous detection result, the second determination is performed, and then matching is performed between the first and second results to determine the detection result. In this case, electric power corresponding to two detection periods (2 T) is consumed. On the other hand, when the result of the first latching and the previous detection result are the same, the second determination is not performed, and a current of the circuit for signal processing, such as the differential amplifier, is also stopped. In this case, electric power consumption corresponding to one detection period T can be reduced. Note that, even when the result of the first latching and the previous detection result are different, if the result of the first latching and the result of the second latching are different, the first determination becomes invalid, and hence electric power corresponding to two detection periods (2T) is consumed even though the detection result VOUT does not change.

In this manner, a result obtained by determination for detection or canceling on the magnetic field intensity may be prevented from being varied due to internal noise or external noise of the magnetic sensor device, and the electric power consumption may be minimized.

Figure 3:
FIG. 3 is a timing chart of an application example of the magnetic sensor device according to the embodiment of the present invention.
Figure 3:
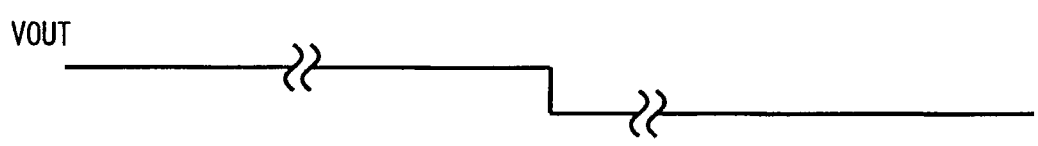
Figure 3:
Figure 4:
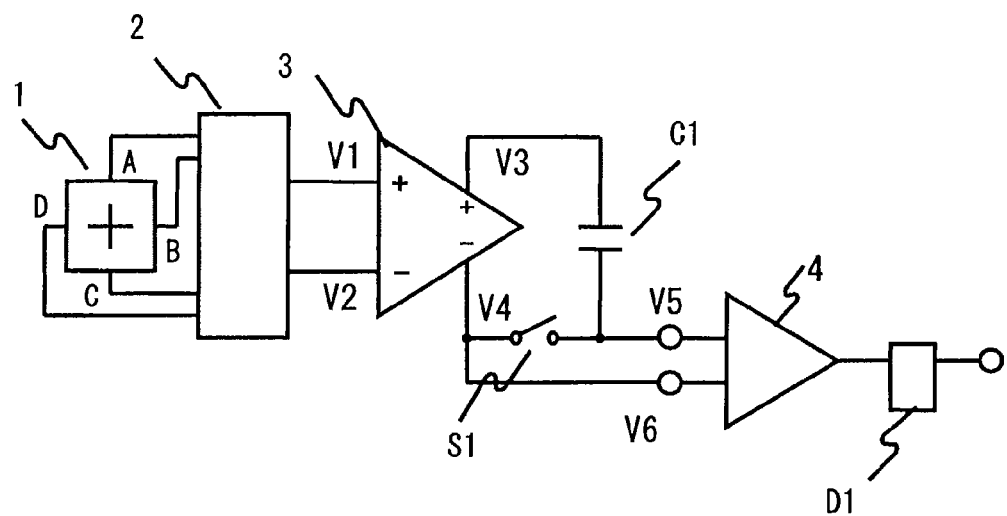
FIG. 4 is a circuit diagram of a conventional magnetic sensor device.

Further, as illustrated in FIG. 3, the present invention can be applied to the application of bipolar detection. As used herein, the bipolar detection means that an output logic is inverted when detection or canceling is determined for any one of the S-pole and the N-pole. In the present invention, for example, when detection or canceling is determined for the S-pole, the S-pole determination is performed again after normal determination for both the S-pole and the N-pole. When the two determination results are the same, the output logic is inverted. In this case, the second N-pole determination is not performed. On the other hand, also when detection or canceling is determined for the N-pole, the N-pole determination is similarly performed again after normal determination for both the S-pole and the N-pole. When the two determination results are the same, the output logic is inverted. In this case, the second S-pole determination is not performed. In this manner, the determination is again performed only for the polarity for which the detection or canceling has been determined, and hence it is possible to realize high-precision detection of a magnetic field intensity and suppression of electric power consumption.

In this embodiment, the output of the comparator 4 is connected to two D-type flip-flops. However, the output of the comparator 4 may be connected to three or more D-type flip-flops. In this case, the result obtained by previous detection is held unless all output values are matched with one another. Therefore, as the number of D-type flip-flops connected in parallel increases, the influence of noise may be further suppressed.

Further, in the magnetic sensor device exemplified in this embodiment, the circuits such as the Hall element 1 and the comparator 4 have the configuration of FIG. 1. However, the circuits are not limited to this circuit configuration. For example, as a reference voltage to be compared in the comparator 4, an arbitrary voltage may be applied from an additionally provided reference voltage circuit.

Further, the magnetic sensor device according to the present invention may be used for alternation detection (for example, rotation detection of a motor). The magnetic sensor device for alternation detection is configured to switch from a state in which only one polarity (for example, S-pole) is detected to a state in which only another polarity (N-pole) is detected upon detection of the one polarity.

Also, a driving method according to the timing chart of FIG. 2 may be changed such that a standby period is not provided between the detection period T and the subsequent detection period T, which produces the same effect.

What is claimed is:

1. A magnetic sensor device for generating a logic output in accordance with a magnetic field intensity applied to a magnetoelectric conversion element,
    the magnetic sensor device comprising:
    a comparator for inputting amplified output signals of the magnetoelectric conversion element, and outputting a comparison result; and
    a logic circuit for performing arithmetic processing on an output signal of the comparator,
    wherein, only when the logic output is changed by a change in the magnetic field intensity, the logic circuit performs successive matching determination of logic outputs a plurality of times.

2. A magnetic sensor device according to claim 1, wherein the logic circuit comprises:
    a first D-type flip-flop and a second D-type flip-flop, each including an input terminal connected to an output terminal of the comparator;
    a first XOR circuit including input terminals connected to an output terminal of the first D-type flip-flop and an output terminal of the second D-type flip-flop, respectively;
    a second XOR circuit including input terminals connected to the output terminal of the first D-type flip-flop and an output terminal of a third D-type flip-flop, respectively;
    a first selector circuit including input terminals connected to the output terminal of the first D-type flip-flop and the output terminal of the third D-type flip-flop, respectively, for selectively outputting an input signal in accordance with an output of the first XOR circuit; and
    a second selector circuit including input terminals connected to the output terminal of the third D-type flip-flop and an output terminal of the first selector circuit, respectively, for selectively outputting an input signal to the third D-type flip-flop in accordance with an output of the second XOR circuit.

3. A magnetic sensor device according to claim 2, further comprising:
    the magnetoelectric conversion element;
    a switching circuit for switching between a first detection state and a second detection state of the magnetoelectric conversion element;
    a differential amplifier for amplifying a voltage difference between two output terminals of the switching circuit;
    a capacitor including one terminal connected to an output terminal of the differential amplifier, for holding an offset; and
    a switch connected to another terminal of the capacitor.

4. A magnetic sensor device according to claim 3, further comprising:
    an AND circuit including input terminals connected to an output terminal of the second XOR circuit and a second ON/OFF signal source, respectively;
    an OR circuit including input terminals connected to an output terminal of the AND circuit and a first ON/OFF signal source, respectively; and
    an ON/OFF circuit for controlling current supply to each of the switching circuit, the differential amplifier, and the comparator in accordance with an output signal of the OR circuit.

5. A magnetic sensor device according to claim 2, wherein:
    each of the first selector circuit and the second selector circuit comprises:
        a first transmission gate connected to a first input terminal;
        a second transmission gate connected to a second input terminal; and
        a select terminal; and
    the each of the first selector circuit and the second selector circuit switches an output of the first transmission gate and an output of the second transmission gate and produces an output, in response to an input signal from the select terminal.

6. A magnetic sensor device according to claim 3, wherein the switching circuit has a function of switching between the first detection state and the second detection state, the first detection state corresponding to a state in which a supply voltage is input to a first terminal pair of the magnetoelectric conversion element and a detection voltage is output from a second terminal pair, the second detection state corresponding to a state in which the supply voltage is input to the second terminal pair of the magnetoelectric conversion element and the detection voltage is output from the first terminal pair.

7. A magnetic sensor device according to claim 6, wherein the logic output is generated according to the magnetic field intensity applied to the magnetoelectric conversion element, the magnetic field intensity being varied among a sample phase in which the offset is held in the capacitor during the first detection state, and a comparison phase in which the applied magnetic field intensity is compared with a reference voltage while the offset is canceled out during the second detection state.

8. A magnetic sensor device according to claim 1, wherein, when the logic output is changed by the change in the magnetic field intensity of any one of an S-pole and an N-pole, the logic circuit performs successive matching determination of logic outputs a plurality of times only for a polarity for which the change in the magnetic field intensity has occurred.

* * * * *